United States Patent
Suh et al.

(10) Patent No.: US 11,978,790 B2
(45) Date of Patent: May 7, 2024

(54) NORMALLY-ON GALLIUM NITRIDE BASED TRANSISTOR WITH P-TYPE GATE

(71) Applicant: Texas Instruments Incorporated, Dallas, TX (US)

(72) Inventors: Chang Soo Suh, Allen, TX (US); Jungwoo Joh, Allen, TX (US); Dong Seup Lee, McKinney, TX (US); Shoji Wada, McKinney, TX (US); Karen Hildegard Ralston Kirmse, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 317 days.

(21) Appl. No.: 17/108,892

(22) Filed: Dec. 1, 2020

(65) Prior Publication Data

US 2022/0173234 A1 Jun. 2, 2022

(51) Int. Cl.
*H01L 29/778* (2006.01)
*H01L 29/20* (2006.01)
*H01L 29/66* (2006.01)
*B82Y 30/00* (2011.01)
*B82Y 40/00* (2011.01)

(52) U.S. Cl.
CPC ...... *H01L 29/7786* (2013.01); *H01L 29/2003* (2013.01); *H01L 29/66462* (2013.01); *B82Y 30/00* (2013.01); *B82Y 40/00* (2013.01)

(58) Field of Classification Search
None
See application file for complete search history.

(56) References Cited

U.S. PATENT DOCUMENTS 6,777,278 B2   8/2004  Smith
8,895,993 B2   11/2014 Kalnitsky et al.
(Continued)

FOREIGN PATENT DOCUMENTS

RU    140462 U1       5/2014
RU    2646536 C1      3/2018
WO    2015/136218 A1  9/2015

OTHER PUBLICATIONS

D. Buttari, et al., Selective dry etching of GaN over AlGaN in BCl3/SF6 mixtures, Proceedings. IEEE Lester Eastman Conference on High Performance Devices, 2004.
(Continued)

*Primary Examiner* — Evren Seven
(74) *Attorney, Agent, or Firm* — Yudong Kim; Frank D. Cimino (57) ABSTRACT

A semiconductor device includes a gallium nitride based low threshold depletion mode transistor (GaN FET) with a threshold potential between −10 volts and −0.5 volts. The GaN FET has a channel layer of III-N semiconductor material including gallium and nitrogen that supports a two-dimensional electron gas (2DEG). The GaN FET has a barrier layer of III-N semiconductor material including aluminum and nitrogen over the channel layer. The GaN FET further has a p-type gate of III-N semiconductor material including gallium and nitrogen. A bottom surface of the gate, adjacent to the barrier layer, does not extend past a top surface of the barrier layer, located opposite from the channel layer. The GaN FET is free of a dielectric layer between the gate and the barrier layer.

24 Claims, 6 Drawing Sheets

(56) References Cited

U.S. PATENT DOCUMENTS

| | | | |
|---|---|---|---|
| 9,502,524 B2 | 11/2016 | Hsiung | |
| 9,960,265 B1 | 5/2018 | Banerjee et al. | |
| 2002/0167023 A1* | 11/2002 | Chavarkar | H01L 29/7783 257/192 |
| 2006/0226412 A1* | 10/2006 | Saxler | H01L 29/7787 257/11 |
| 2007/0176215 A1* | 8/2007 | Yanagihara | H01L 29/66462 257/E29.253 |
| 2008/0079023 A1* | 4/2008 | Hikita | H01L 29/66462 257/E29.252 |
| 2010/0133441 A1 | 6/2010 | Aurola | |
| 2010/0283083 A1* | 11/2010 | Niiyama | H01L 29/7813 257/192 |
| 2011/0156212 A1* | 6/2011 | Arena | H01L 29/2003 438/455 |
| 2015/0014699 A1 | 1/2015 | Motonobu et al. | |
| 2015/0123139 A1* | 5/2015 | Kim | H01L 29/66462 438/172 |
| 2018/0366559 A1* | 12/2018 | Cao | H01L 21/30621 |
| 2020/0111891 A1* | 4/2020 | Chen | H01L 21/0254 |
| 2021/0376136 A1* | 12/2021 | Akutsu | H01L 21/30621 |
| 2022/0416072 A1* | 12/2022 | Otake | H01L 29/66462 |

OTHER PUBLICATIONS

Han, et al., Highly Selective Dry Etching of GaN over AlGaN Using Inductively Coupled Cl2/N2/O2 Plasmas, Japanese Journal of Applied Physics, vol. 42 (2003) Pt. 2, No. 10A.

T92513WO, PCT/US 2021/061061, PCT International Search Report, dated Mar. 17, 2022.

\* cited by examiner

NORMALLY-ON GALLIUM NITRIDE BASED TRANSISTOR WITH P-TYPE GATE

FIELD

This disclosure relates to the field of semiconductor devices. More particularly, but not exclusively, this disclosure relates to gallium nitride transistors in semiconductor devices.

BACKGROUND

A normally-on gallium nitride based field effect transistor (GaN FET) may be used for a power switching application. A normally-on GaN FET is also known as a depletion mode GaN FET. A depletion mode GaN FET commonly has a gate insulator film of dielectric material, such as silicon nitride, silicon dioxide and/or aluminum oxide, between the gate and the barrier layer, to reduce gate leakage and ensure product reliability. For a power switching application, normally-off operation, also known as enhancement mode operation, is desired. A normally-on GaN FET can be paired up with a low voltage silicon transistor in a cascode circuit to operate in a normally-off mode. In a cascode circuit, the GaN FET and the silicon transistor are connected in series. The threshold potential of the GaN FET, that is, a bias potential on the gate with respect to the source, to turn on the GaN FET, is commonly a negative voltage with a magnitude above 10 volts. A size of the Si transistor is primarily determined by the magnitude of the threshold voltage of the normally-on GaN FET, with greater magnitude threshold potentials requiring larger silicon transistors, leading to higher costs, increased overall on-resistance contribution and reduction of available space for the GaN transistor within a given package.

SUMMARY

The present disclosure introduces a semiconductor device including a gallium nitride based low threshold depletion mode transistor, the GaN FET. The GaN FET has a channel layer of III-N semiconductor material including gallium and nitrogen that supports a two-dimensional electron layer, commonly referred to as the two-dimensional electron gas (2DEG). The GaN FET has a barrier layer of III-N semiconductor material including aluminum and nitrogen over the channel layer. The GaN FET further has a p-type gate of III-N semiconductor material including gallium and nitrogen. A bottom surface of the gate, adjacent to the barrier layer, does not extend past a top surface of the barrier layer, located opposite from the channel layer. The GaN FET is free of a dielectric layer between the gate and the barrier layer.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

A semiconductor device includes a gallium nitride based low threshold depletion mode transistor, the GaN FET. The GaN FET has a channel layer of III-N semiconductor material including gallium and nitrogen that supports a two-dimensional electron layer, commonly referred to as the two-dimensional electron gas (2DEG). The GaN FET has a barrier layer of III-N semiconductor material including aluminum and nitrogen over the channel layer. The GaN FET further has a p-type gate of III-N semiconductor material including gallium and nitrogen. A bottom surface of the gate, adjacent to the barrier layer, does not extend past a top surface of the barrier layer, located opposite from the channel layer. There is no dielectric layer between the gate and the barrier layer. The GaN FET has a gate-source threshold potential, referred to herein as the threshold potential, between −10 volts and −0.1 volts.

For the purposes of this description, the term "III-N" is understood to refer to semiconductor materials in which group III elements, that is, aluminum, gallium and indium, and possibly boron, provide a portion of the atoms in the semiconductor material and nitrogen atoms provide another portion of the atoms in the semiconductor material. Examples of III-N semiconductor materials are gallium nitride, boron gallium nitride, aluminum gallium nitride, indium nitride, and indium aluminum gallium nitride. Terms describing elemental formulas of materials do not imply a particular stoichiometry of the elements. For example, aluminum gallium nitride may be written as AlGaN, which covers a range of relative proportions of aluminum and gallium.

It is noted that terms such as top, bottom, over, above, and under may be used in this disclosure. These terms should not be construed as limiting the position or orientation of a structure or element, but should be used to provide spatial relationship between structures or elements. The terms "lateral" and "laterally" refer to directions parallel to a plane of top surface of the channel layer.

Figure 1A:
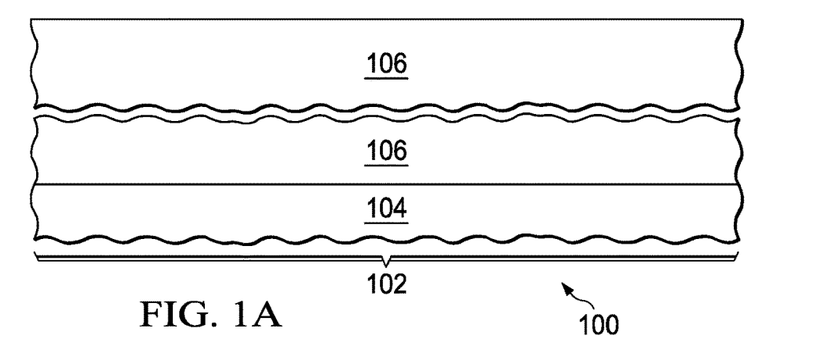
FIG. 1A through FIG. 1K are cross sections of an example semiconductor device including a low threshold depletion mode gallium nitride field effect transistor, depicted in stages of formation.

FIG. 1A through FIG. 1K are cross sections of an example semiconductor device 100 including a low threshold depletion mode gallium nitride field effect transistor 102, referred to in this example as the GaN FET 102, depicted in stages of formation. Referring to FIG. 1A, the semiconductor device 100 may be formed on a substrate 104, such as a silicon wafer, a sapphire wafer, or a silicon carbide wafer.

A buffer layer 106 of one or more layers of III-N semiconductor material may be formed on the substrate 104. In versions of this example in which the substrate 104 is implemented as a silicon wafer or a sapphire wafer, the buffer layer 106 may include a nucleation layer having a stoichiometry that includes aluminum, to match a lattice constant of the substrate 104. The buffer layer 106 may further include sublayers of gallium aluminum nitride with decreasing aluminum content, culminating in an unintentionally doped gallium nitride layer. The buffer layer 106 on silicon or sapphire may be 1 micron to several microns thick. In versions of this example in which the substrate 104 is implemented as a silicon carbide wafer, the buffer layer 106 may be thinner, due to a closer match in lattice constant between gallium nitride and silicon carbide. The buffer layer 106 may be formed by a buffer metal organic vapor phase epitaxy (MOVPE) process with several operations to form the nucleation layer and sublayers. The buffer layer 106 overlaps an area for the GaN FET 102.

Figure 1B:
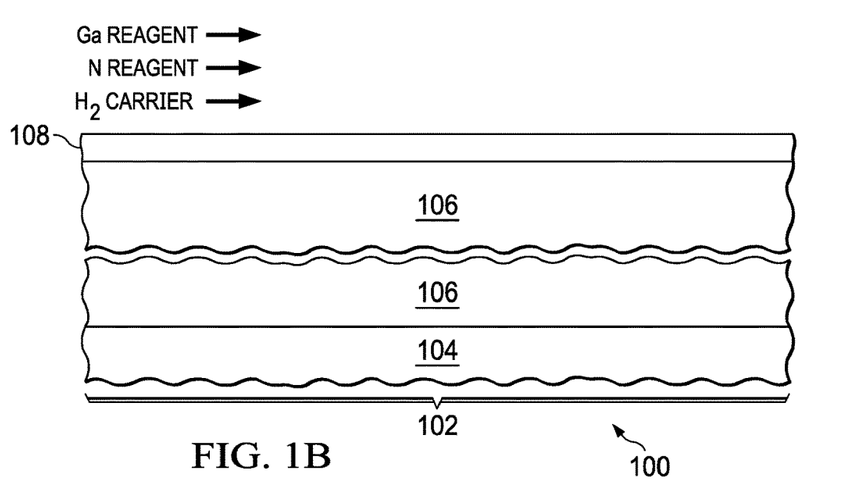

Referring to FIG. 1B, a channel layer 108 of III-N semiconductor material is formed on the buffer layer 106. The channel layer 108 includes gallium and nitrogen, and may include primarily gallium nitride, with optional trace amounts of other group III elements, such as aluminum or indium. The channel layer 108 may be formed by a channel MOVPE process using a gallium-containing gas reagent and a nitrogen-containing gas reagent, labeled "Ga REAGENT" and "N REAGENT" respectively, in FIG. 1B. The substrate 104 may be heated to 900° C. to 1100° C. during the channel MOVPE process. The gallium-containing gas reagent may be implemented as trimethylgallium or triethylgallium, for example. The nitrogen-containing gas reagent may be implemented as ammonia, hydrazine, or 1,1 dimethylhydrazine, for example. The channel MOVPE process uses a carrier gas, labeled "H$_2$CARRIER" in FIG. 1B. The carrier gas may include primarily hydrogen gas, or may include hydrogen with another gas such as nitrogen. The channel layer 108 may be 1 nanometer to 10 nanometers thick, by way of example. In an alternate version of this example, the channel layer 108 may be formed as a last portion of the buffer layer 106. During operation of the GaN FET 102, the channel layer supports a 2DEG.

Figure 1C:
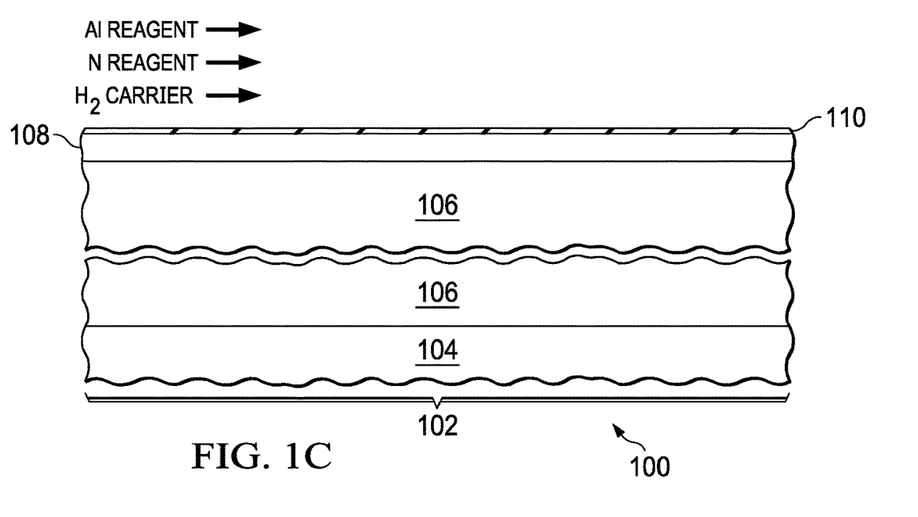

Referring to FIG. 1C, an optional high bandgap sublayer 110 of III-N semiconductor material may be formed on the channel layer 108. The high bandgap sublayer 110 includes primarily aluminum and nitrogen, to provide a higher bandgap than a subsequently-formed barrier layer 112, shown in FIG. 1D. In some versions of this example, the high bandgap sublayer 110 may consist essentially of aluminum nitride, with trace amounts of other group III elements, such as gallium.

The high bandgap sublayer 110 may be formed by a high bandgap MOVPE process using an aluminum-containing gas reagent and a nitrogen-containing gas reagent, labeled "Al REAGENT" and "N REAGENT" respectively, in FIG. 1C. The aluminum-containing gas reagent may be implemented as trimethylaluminum or triethylaluminum, for example. The nitrogen-containing gas reagent may be implemented as ammonia, hydrazine, or 1,1 dimethylhydrazine, as disclosed in reference to forming the channel layer 108. The substrate 104 may be heated to 900° C. to 1100° C. during the high bandgap MOVPE process. The high bandgap MOVPE process uses a carrier gas, labeled "H$_2$CARRIER" in FIG. 1C. The carrier gas may include primarily hydrogen gas, or may include hydrogen with another gas such as nitrogen. The high bandgap sublayer 110 may be 0.5 nanometers to 3 nanometers thick, by way of example. The optional high bandgap sublayer 110, if formed, may improve charge confinement in a subsequently-formed 2DEG 114, shown in FIG. 1D, by providing a deeper quantum well in the channel layer 108, advantageously providing an increased free charge carrier density in the 2DEG 114.

Figure 1D:
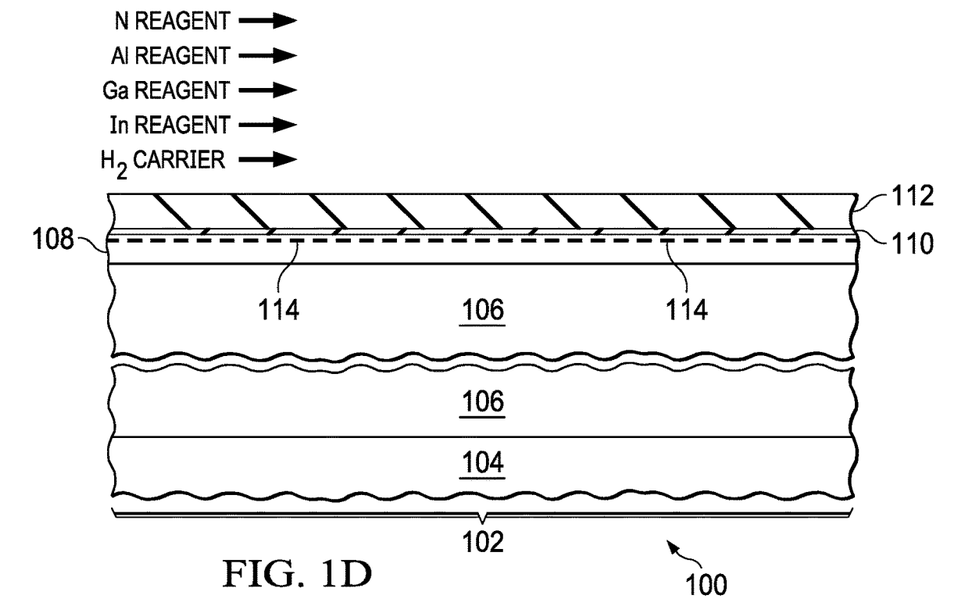

Referring to FIG. 1D, the barrier layer 112 of III-N semiconductor material is formed over the channel layer 108, on the optional high bandgap sublayer 110, if present. The barrier layer 112 includes aluminum and nitrogen. In one version of this example, the barrier layer 112 may include gallium, at a lower atomic percent than the aluminum. In another version of this example, the barrier layer 112 may have a stoichiometry of $Al_{.83}In_{.17}N$, within a few atomic percent, which provides a close lattice match to gallium nitride. In a further version, the barrier layer 112 may include gallium and indium; the gallium may improve uniformity of the indium in the barrier layer 112. The barrier layer 112 may have a thickness of 1 nanometer to 60 nanometers.

The barrier layer 112 may be formed by a barrier MOVPE process using an aluminum-containing gas reagent and a nitrogen-containing gas reagent, labeled "Al REAGENT" and "N REAGENT" respectively, in FIG. 1D. The aluminum-containing gas reagent may be implemented as trimethylaluminum or triethylaluminum, for example. The nitrogen-containing gas reagent may be implemented as ammonia, hydrazine, or 1,1 dimethylhydrazine, as disclosed in reference to forming the channel layer 108.

In versions of this example in which the barrier layer 112 includes gallium, the barrier MOVPE process uses a gallium-containing gas reagent, labeled "Ga REAGENT" in FIG. 1D. The gallium-containing gas reagent may be implemented as trimethylgallium or triethylgallium, as disclosed in reference to forming the channel layer 108. In versions of this example in which the barrier layer 112 includes indium, the barrier MOVPE process uses an indium-containing gas reagent, labeled "In REAGENT" in FIG. 1D. The indium-containing gas reagent may be implemented as trimethylindium or triethylindium, for example. The barrier MOVPE process uses a carrier gas, labeled "H$_2$CARRIER" in FIG. 1D. The carrier gas may include primarily hydrogen gas, or may include hydrogen with another gas such as nitrogen. The substrate 104 may be heated to 900° C. to 1100° C. during the barrier MOVPE process.

The barrier layer 112 induces the 2DEG 114 in the channel layer 108 adjacent to the barrier layer 112. The stoichiometry and thickness of the barrier layer 112 may provide a free charge carrier density of $3\times10^{12}$ cm$^{-2}$ to $2\times10^{13}$ cm$^{-2}$, to provide a desired on-state resistance for the GaN FET 102.

Figure 1E:
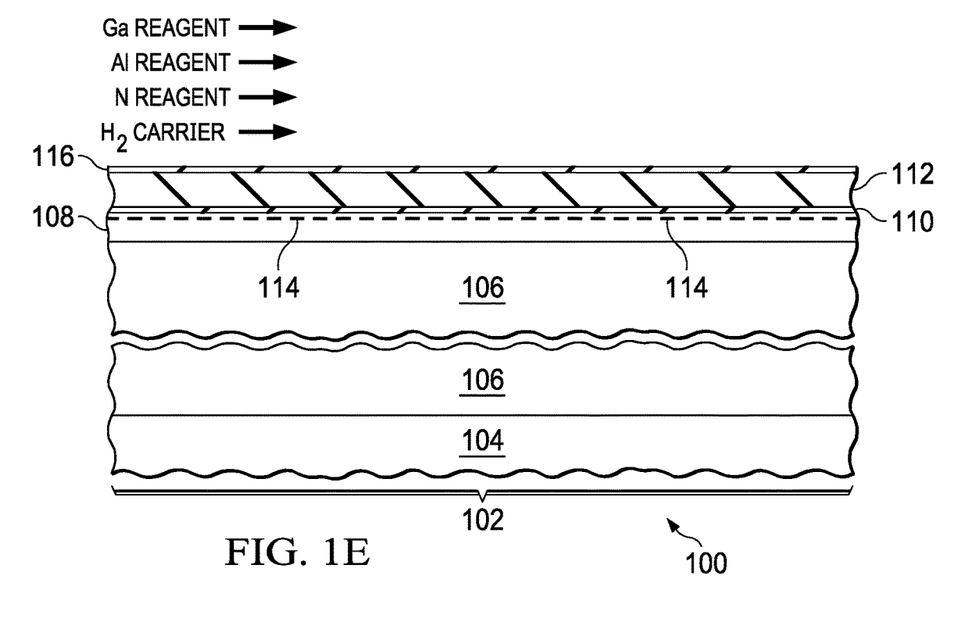

Referring to FIG. 1E, an optional etch stop layer 116, may be formed on the barrier layer 112. The etch stop layer 116 has a higher aluminum content than the barrier layer 112. The etch stop layer 116 may include primarily aluminum nitride semiconductor material. The etch stop layer 116 may be 0.5 nanometers to 3 nanometers thick, and may be formed by an etch stop MOVPE process similar to the high bandgap MOVPE process used to form the high bandgap sublayer 110. The etch stop layer 116 may advantageously reduce or eliminate etching of the barrier layer 112 during a subsequent gate etch process.

Figure 1F:
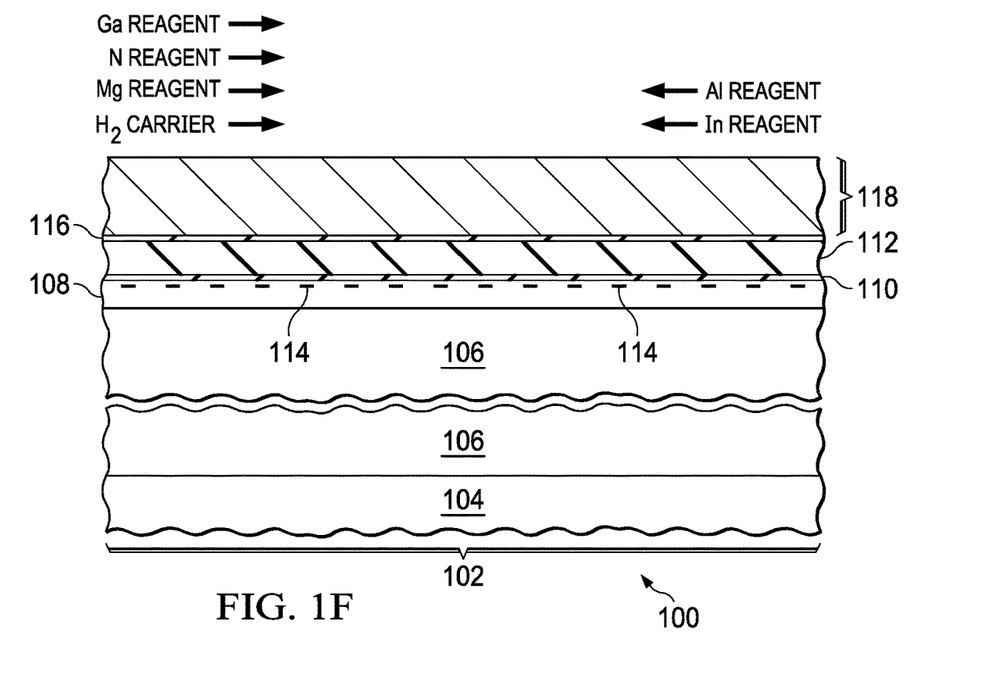

Referring to FIG. 1F, a gate layer 118 of p-type III-N semiconductor material is formed over the barrier layer 112, on the optional etch stop layer 116, if present. The gate layer 118 may include primarily gallium nitride, with magnesium dopant to provide p-type conductivity. In some versions of this example, the gate layer 118 may include other group III elements, such as aluminum or indium, at less than 10 atomic percent.

The gate layer 118 may be formed by a gate MOVPE process using a gallium-containing gas reagent, a nitrogen-containing gas reagent, and a p-type dopant gas reagent, labeled "Ga REAGENT", "N REAGENT", and "Mg REAGENT" respectively, in FIG. 1F. The gallium-containing gas reagent may be implemented as trimethylgallium or triethylgallium, for example. The nitrogen-containing gas reagent may be implemented as ammonia, hydrazine, or 1,1 dimethylhydrazine, as disclosed in reference to forming the channel layer 108. The p-type dopant gas reagent may be implemented as bis(cyclopentadienyl)magnesium, by way of example. Other sources of magnesium-containing gas reagents are within the scope of this example. Further, other implementations of the p-type dopant gas to provide p-type dopants other than magnesium are also within the scope of this example. In versions of this example in which the p-type dopant is implemented as magnesium, the magnesium concentration in the gate layer 118 may be $1 \times 10^{17}$ cm$^{-3}$ to $1 \times 10^{20}$ cm$^{-3}$, to provide a desired threshold potential for the GaN FET 102.

In versions of this example in which the gate layer 118 includes aluminum, the gate MOVPE process uses an aluminum-containing gas reagent, labeled "Al REAGENT" in FIG. 1F. The aluminum-containing gas reagent may be implemented as trimethylaluminum or triethylaluminum, as disclosed in reference to forming the barrier layer 112. In versions of this example in which the gate layer 118 includes indium, the gate MOVPE process uses an indium-containing gas reagent, labeled "In REAGENT" in FIG. 1F. The indium-containing gas reagent may be implemented as trimethylindium or triethylindium, as disclosed in reference to forming the barrier layer 112. The barrier MOVPE process uses a carrier gas, labeled "H$_2$CARRIER" in FIG. 1F. The carrier gas may include primarily hydrogen gas, or may include hydrogen with another gas such as nitrogen. The substrate 104 may be heated to 900° C. to 1100° C. during the gate MOVPE process.

The gate layer 118 may be 5 nanometers to 500 nanometers thick, to provide a desired threshold potential for the GaN FET 102. The gate layer 118 reduces the free charge carrier density in the 2DEG 114 by 25 percent to 99 percent, as a result of the work function of the gate layer 118 reducing the quantum well in the channel layer 108. The 2DEG 114 retains a finite free charge carrier density of electrons after the gate layer 118 is formed.

Figure 1G:
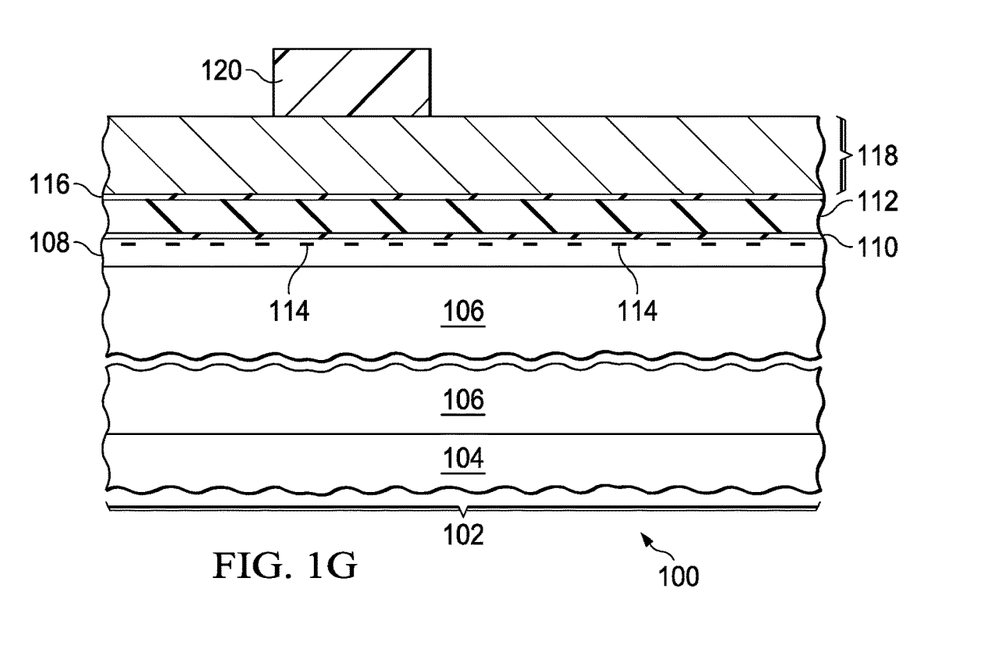

Referring to FIG. 1G, a gate mask 120 is formed on the gate layer 118. The gate mask covers an area of the gate layer 118 for a subsequently-formed gate 124, shown in FIG. 1H. In one version of this example, the gate mask 120 may include photoresist, formed directly by a photolithographic process. The gate mask 120 may include organic anti-reflection material such as a bottom anti-reflection coat (BARC) layer under the photoresist. The BARC layer may be patterned after the photolithographic process is completed. In another version of this example, the gate mask 120 may include inorganic hard mask material, such as silicon dioxide or silicon nitride. In a further version, the gate mask 120 may include metal hard mask material, such as nickel. The hard mask material, inorganic or metal, may be patterned by forming a photoresist pattern over the hard mask material, followed by etching the hard mask material using a reactive ion etch (RIE) process using fluorine radicals or an ion milling process. Hard mask material in the gate mask 120 may provide improved control of the lateral dimension of the gate 124.

Figure 1H:
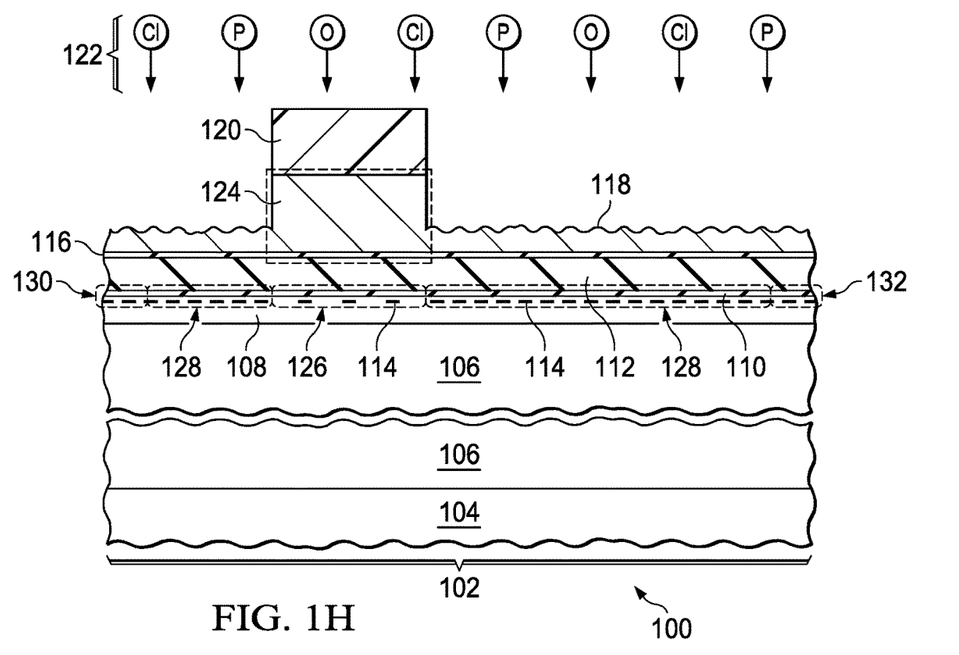

Referring to FIG. 1H, a gate etch process 122 removes the gate layer 118 where exposed by the gate mask 120, leaving the gate layer 118 under the gate mask 120 to form the gate 124. The gate etch process 122 may be performed in an inductively coupled plasma (ICP) etcher, or a capacitively coupled plasma etcher, which generates a plasma containing chemically reactive neutral species, ions, and electrons. The gate etch process 122 includes a chemical etchant species, a physical etchant species, and an aluminum passivating species. The chemical etchant species may be implemented as chlorine radicals, labeled "Cl" in FIG. 1H, or bromine radicals, for example. The chlorine radicals may be provided by chlorine gas, silicon tetrachloride, boron trichloride, or a combination thereof. The bromine radicals may be provided by boron tribromide, for example.

The physical etchant species may be implemented by one or more ion species. Examples of the physical etchant species include fluorine ions, noble gas ions such as argon ions or helium ions, and oxygen ions. Other ion species in the physical etchant species are within the scope if this example. The fluorine ions may be provided by silicon hexafluoride, carbon tetrafluoride, or nitrogen trifluoride, for example. The noble gas ions may be provided by argon gas or helium gas. The oxygen ions may be provided by oxygen gas or carbon monoxide gas, for example. The physical etchant species are labeled "P" in FIG. 1H, to denote the physical etchant species, and may include a plurality of ion species.

The aluminum passivating species may be implemented as oxygen radicals, labeled "O" in FIG. 1H, or fluorine radicals. The oxygen radicals may be provided by oxygen gas. The fluorine radicals may be provided by silicon hexafluoride, carbon tetrafluoride, or nitrogen trifluoride, for example.

The chemical etchant species binds to gallium atoms and nitrogen atoms in the gate layer 118. The physical etchant species impacts the gate layer 118 and imparts sufficient energy to facilitate separation of the gallium atoms and nitrogen atoms that are bound to the chemical etchant species from the gate layer 118. The gallium atoms and nitrogen atoms that are separated from the gate layer 118 are removed by the ICP etcher. The ICP etcher has a first power supply for forming a plasma which generates the chemical etchant species, the physical etchant species, and the aluminum passivating species, and a second power supply to independently control a potential difference between the plasma and the substrate 104. The first power supply may be operated at a power of 250 watts to 500 watts, for a 150 millimeter wafer, by way of example. The second power supply may be adjusted to operate initially at 20 watts to 100 watts, to provide an impact energy of the physical etchant species sufficient to facilitate separation of the gallium atoms and nitrogen atoms from the gate layer 118. As the gate etch process 122 nears completion, the power level of the second power supply may be reduced, to 20 watts to 50 watts to reduce the energy provided for chemical reactions, which reduces removal of aluminum more significantly than removal of gallium, thus providing etch selectivity. Reducing the power level of the second power supply may thus decrease an etch rate of the etch stop layer 116, if present, or the barrier layer 112 if the etch stop layer 116, is not present, relative to the gate layer 118, because the gate layer 118 includes more gallium and less aluminum than the etch stop layer 116 and the barrier layer 112.

The gate etch process 122 may be performed at a pressure 10 millitorr to 50 millitorr, to improve the etching selectivity. The aluminum passivating species further improves the etching selectivity by combining preferentially with aluminum in the etch stop layer 116, if present, or in the barrier layer 112 if the etch stop layer 116, is not present, minimizing the sites available for the chemical etchant species to react with the gallium and nitrogen. Thus, the gate etch process 122 may remove the gate layer 118 completely where exposed by the gate mask 120, without removing a significant amount of the etch stop layer 116 or the barrier layer 112. FIG. 1H depicts the gate etch process 122 partway to completion.

The 2DEG 114 includes a channel region 126 under the gate 124. As the gate layer 118 is removed, the free charge carrier density in the channel region remains at the low value disclosed in reference to FIG. 1F, because the thickness of the gate layer 118 remains constant in the gate 124.

The 2DEG 114 includes access regions 128 adjacent to the channel region 126. As the gate layer 118 is removed, the free charge carrier density in the 2DEG 114 increases in the access regions 128, because the thickness of the gate layer 118 is decreasing outside of the gate 124.

The 2DEG 114 includes a source region 130 in an area for a source of the GaN FET 102. The source region 130 is laterally separated from the channel region 126 by one of the access regions 128. The 2DEG 114 includes a drain region 132 in an area for a drain of the GaN FET 102. The drain region 132 is laterally separated from the channel region 126 by another of the access regions 128, and is located opposite from the source region 130.

Figure 1I:
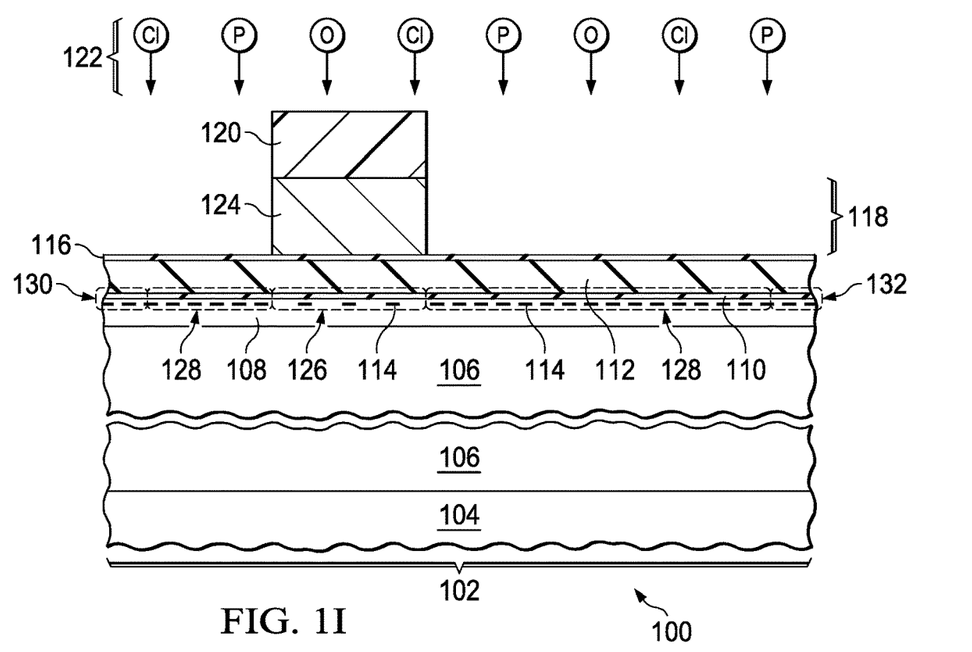

Referring to FIG. 1I, the gate etch process 122 may be continued in an overetch step, after the gate layer 118 is removed outside of the gate 124. Reducing the power level of the second power supply and providing the aluminum passivating species may advantageously enable complete removal of the gate layer 118 across the substrate 104, despite variations in thickness of the gate layer 118 across the substrate 104, without removing a significant amount of the etch stop layer 116 or the barrier layer 112.

The free charge carrier density of the 2DEG 114 in the access regions 128 may increase to a value comparable to the free charge carrier density before the gate layer 118 was formed. The free charge carrier density of the 2DEG 114 in the access regions 128 may be $3 \times 10^{12}$ cm$^{-2}$ to $2 \times 10^{13}$ cm$^{-2}$, to provide the desired on-state resistance for the GaN FET 102. The channel region 126 of the 2DEG 114 retains a non-zero density of electrons, 1 percent to 75 percent of the free charge carrier density of the 2DEG 114 in the access regions 128.

The gate mask 120 is subsequently removed. Photoresist and other organic material in the gate mask 120 may be removed by an oxygen plasma process, a wet etch process, or a combination of both. Inorganic hard mask material in the gate mask 120 may be removed by an RIE process using fluorine radicals or a wet etch process, using an aqueous solution of hydrofluoric acid, for example. Metal in the gate mask 120 may be removed by a wet etch process using a combination of nitric acid, acetic acid and sulfuric acid, or a solution of ferric chloride.

The gate etch process 122 and removal of the gate mask 120 may remove an insignificant amount from the gate layer 118 from the gate 124, or may remove none of the gate layer 118 from the gate 124, so that the gate 124 may be 5 nanometers to 500 nanometers thick.

Figure 1J:
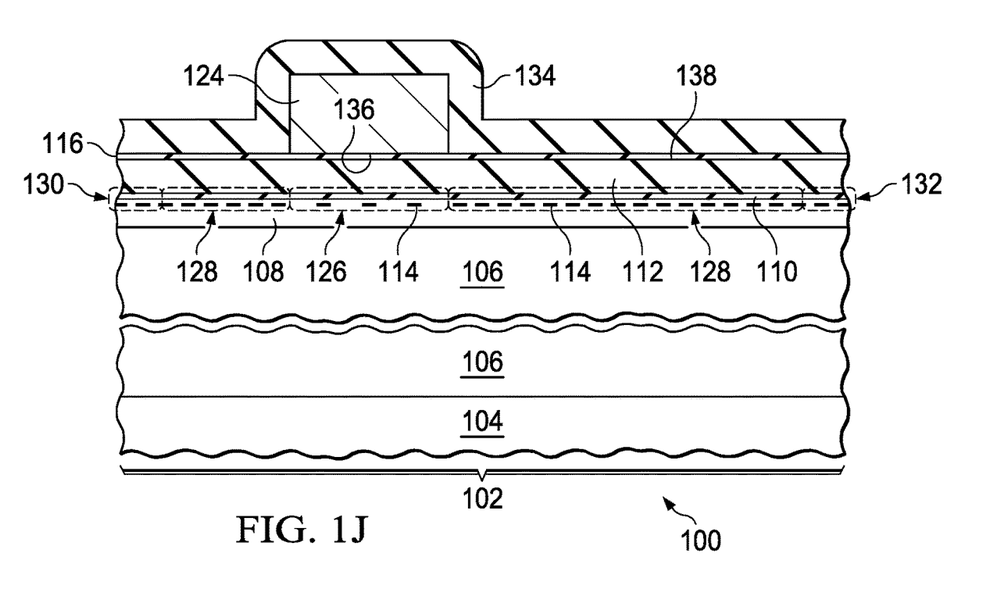

Referring to FIG. 1J, a dielectric layer 134 may be formed over the barrier layer 112 adjacent to the gate 124. The dielectric layer 134 may include one or more sublayers of silicon dioxide, silicon nitride, aluminum oxide, or any combination thereof. The dielectric layer 134 may be formed by one or more low pressure chemical vapor deposition (LPCVD) processes, plasma enhanced chemical vapor deposition (PECVD) processes, high density plasma (HDP) processes, or atomic layer deposition (ALD) processes, by way of example. The dielectric layer 134 may advantageously protect the barrier layer 112 from physical or chemical degradation. The dielectric layer 134 may extend over the gate 124, as depicted in FIG. 1J.

A bottom surface 136 of the gate 124, adjacent to the barrier layer 112, does not extend past a top surface 138 of the barrier layer 112, located opposite from the channel layer 108, advantageously enabling the GaN FET 102 to be formed without a gate recess etch, which would increase fabrication cost and complexity. The GaN FET is free of any dielectric material between the gate 124 and the barrier layer 112, advantageously enabling the GaN FET 102 to be formed without forming a gate dielectric layer, which would also increase fabrication cost and complexity. The GaN FET is free of III-N semiconductor material adjacent to the gate 124, extending above the bottom surface 136 of the gate 124, advantageously enabling the GaN FET 102 to be formed without forming a barrier regrowth layer, which would further increase fabrication cost and complexity.

Figure 1K:
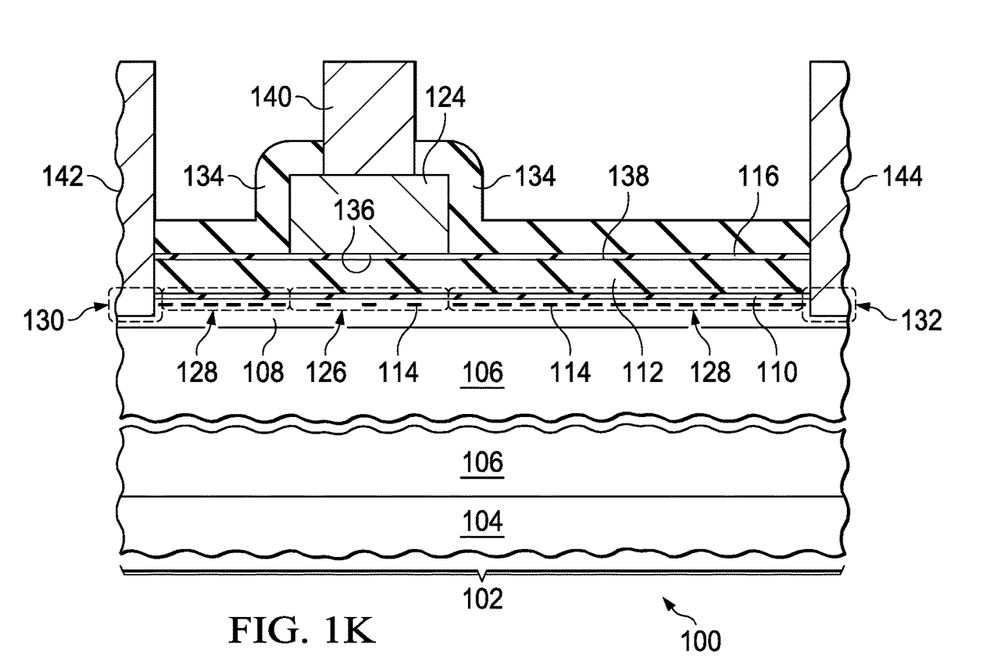

Referring to FIG. 1K, a gate contact 140 is formed through the dielectric layer 134, contacting the gate 124. The gate contact 140 may be aligned with an opening through the dielectric layer 134, as depicted in FIG. 1K, or may extend partway over the dielectric layer 134 around the opening. A source contact 142 is formed through the dielectric layer 134 and the barrier layer 112, contacting the 2DEG 114 at the source region 130. A drain contact 144 is formed through the dielectric layer 134 and the barrier layer 112, contacting the 2DEG 114 at the drain region 132. The gate contact 140, the source contact 142, and the drain contact 144 are electrically conductive, and may include one or more metals, such as titanium, tungsten, or aluminum, or may include other electrically conductive material such as carbon nanotubes or graphene.

During operation of the GaN FET 102, a positive voltage bias is applied to the drain contact 144 with respect to the source contact 142, while a negative voltage bias is applied to the gate contact 140 with respect to the source contact 142. The negative voltage bias that is applied to the gate contact 140 is sufficiently negative that the free charge carrier density of electrons in the channel region 126 of the 2DEG 114 is essentially zero, that is, the free charge carrier density of electrons in the channel region 126 is at least four orders of magnitude less than the free charge carrier density of electrons in the access regions 128 of the 2DEG 114. The gate 124 is said to be biased below threshold. Because the free charge carrier density of electrons in the channel region 126 is essentially zero, essentially no current, that is, less than 10 microamps per micron of width of the channel region 126 flows from the drain contact 144 through the GaN FET 102 to the source contact 142. The GaN FET 102 is in an off state when the gate 124 is biased below threshold.

During operation of the GaN FET 102, the voltage bias applied to the gate contact 140 is increased above the threshold potential, which is between −10 volts and −0.1 volts, causing electrons to accumulate in the channel region 126. The gate 124 is said to be biased above threshold. Applying a positive voltage bias to the drain contact 144 with respect to the source contact 142, while the gate 124 is biased above threshold, results in current flowing from the drain contact 144 through the GaN FET 102 to the source contact 142. The GaN FET 102 is in an on state when the gate 124 is biased above threshold. Having the threshold potential between −10 volts and −0.1 volts may advantageously enable use of a smaller driver to apply the bias voltage to the gate contact 140 compared to a driver required for a GaN FET with a threshold potential between −50 volts and −20 volts, for example.

Figure 2:
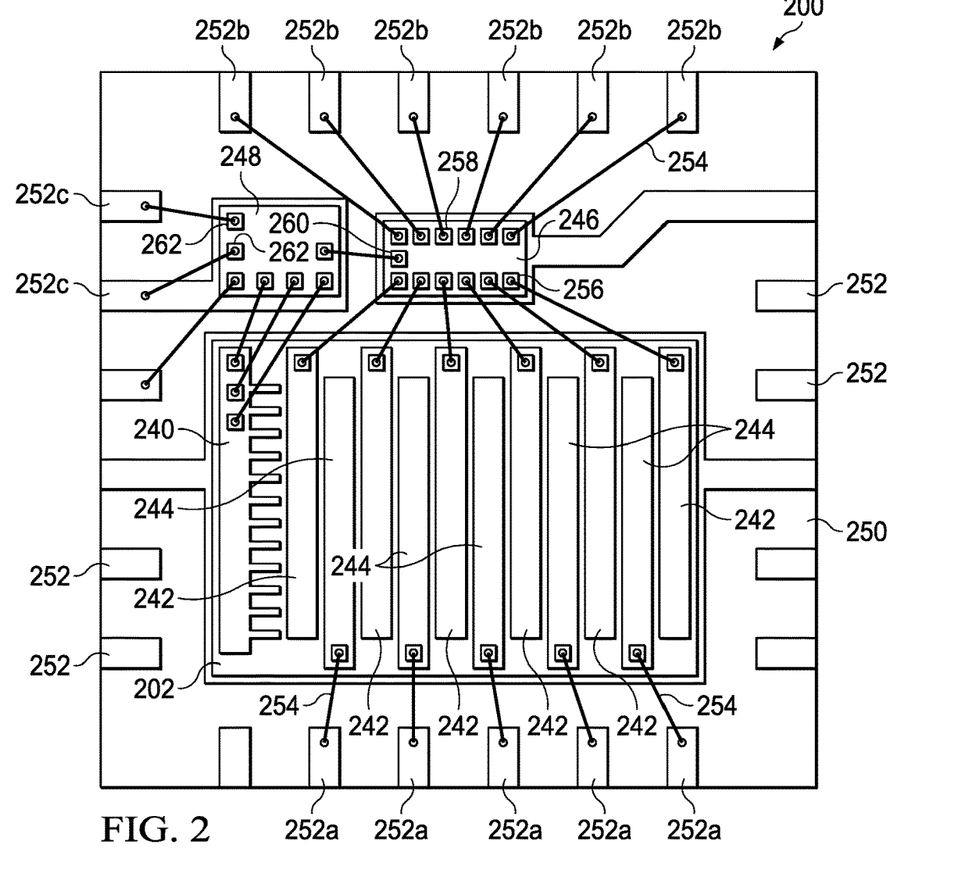
FIG. 2 is a top view of an example semiconductor device that includes a low threshold depletion mode gallium nitride field effect transistor, and a silicon metal oxide semiconductor field effect transistor.
Figure 3:
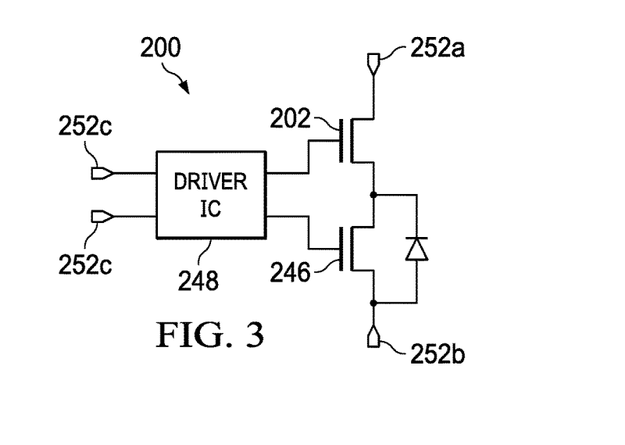
FIG. 3 is a circuit schematic of an example semiconductor device that includes a low threshold depletion mode gallium nitride field effect transistor, and a silicon metal oxide semiconductor field effect transistor.

FIG. 2 is a top view and FIG. 3 is a circuit schematic of an example semiconductor device 200 that includes a low threshold depletion mode gallium nitride field effect transistor 202, referred to in this example as the GaN FET 202, and a silicon metal oxide semiconductor field effect transistor (MOSFET) 246 connected in series to the GaN FET 202. The semiconductor device 200 may optionally include a driver integrated circuit (IC) 248 connected to the GaN FET 202 and the MOSFET 246. The semiconductor device 200 may be in a quad flatpack no-leads (QFN) package, as depicted in FIG. 2, or may be packaged in another package type. Encapsulation material 250 is removed from over the GaN FET 202, the MOSFET 246, and the driver IC 248 in FIG. 3. The semiconductor device 200 has external leads 252 that provide connections to external components, not shown. Drain contacts 244 of the GaN FET 202 are connected to drain leads 252*a* of the external leads 252 by wire bonds 254. Source contacts 242 of the GaN FET 202 are connected to drain terminals 256 of the MOSFET 246 by additional wire bonds 254. Source terminals 258 of the MOSFET 246 are connected to source leads 252*b* of the external leads 252 by further wire bonds 254. In this example, the driver IC 248 may be connected to a gate contact 240 of the GaN FET 202 and to a gate terminal 260 of the MOSFET 246. Alternatively, the gate terminal 260 of the MOSFET 246 may be connected to one of the external leads 252. Input terminals 262 of the driver IC 248 are connected to control leads 252*c* of the external leads 252 by further wire bonds 254.

The GaN FET 202 has a structure as shown in FIG. 1K, and has a threshold potential between −10 volts and −0.5 volts. During operation of the semiconductor device 200, the MOSFET 246 operates at a drain-source potential difference corresponding to a magnitude of the threshold potential of the GaN FET 202. Having the threshold potential between −10 volts and −0.5 volts enables a smaller size for the MOSFET 246 compared to a comparable semiconductor device with a GaN FET having a threshold potential between −50 volts and −20 volts. As an example, the MOSFET 246 may be 2 to 5 times smaller than MOSFET required for a GaN FET having a threshold potential of −30 volts. Having the smaller size for the MOSFET 246 may advantageously provide a lower cost for the semiconductor device 200.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A method, comprising:
   forming a channel layer of III-N semiconductor material of a gallium nitride field effect transistor (GaN FET), the channel layer including gallium and nitrogen;
   forming a barrier layer of III-N semiconductor material over the channel layer, the barrier layer including aluminum and nitrogen, wherein two-dimensional electron gas (2DEG) forms in the channel layer proximate the barrier layer as a result of forming the barrier layer, the 2DEG with a first free charge carrier density;
   forming an etch stop layer of III-N semiconductor material directly on the barrier layer, the etch stop layer including an aluminum content greater than the barrier layer;
   forming a p-type gate layer of III-N semiconductor material directly on the etch stop layer, the p-type gate layer including gallium and nitrogen;
   forming a gate mask on the p-type gate layer, the gate mask covering the p-type gate layer over an area for a p-type gate of the GaN FET;
   removing the p-type gate layer over the etch stop layer where exposed by the gate mask to form the p-type gate, wherein:
     the 2DEG under the p-type gate has a second free charge carrier density that is non-zero and less than the first free charge carrier density; and
     the 2DEG under the p-type gate is connected to the 2DEG outside a footprint of the p-type gate such that the GaN FET is normally on, the 2DEG outside the footprint of the p-type gate having the first free charge carrier density; and
   removing the gate mask.

2. The method of claim 1, wherein the barrier layer has a thickness of 1 nanometer to 60 nanometers.

3. The method of claim 1, wherein forming the barrier layer includes using a gallium containing gas reagent, so that the barrier layer includes gallium.

4. The method of claim 1, wherein forming the barrier layer includes using an indium containing gas reagent, so that the barrier layer includes indium.

5. The method of claim 1, wherein the p-type gate layer is 5 nanometers to 500 nanometers thick.

6. The method of claim 1, wherein forming the p-type gate layer includes using a magnesium containing gas reagent, so that the p-type gate layer has a magnesium concentration of $1 \times 10^{17}$ cm$^{-3}$ to $1 \times 10^{20}$ cm$^{-3}$.

7. The method of claim 1, wherein removing the p-type gate layer where exposed by the gate mask is performed using an inductively coupled plasma (ICP) process.

8. The method of claim 7, wherein the ICP process uses oxygen ions, chlorine ions, argon ions, or a combination thereof.

9. The method of claim 1, wherein the etch stop layer is 0.5 nanometers to 3 nanometers thick.

10. The method of claim 1, further comprising:
    forming a dielectric layer over the etch stop layer and the p-type gate, after removing the gate mask.

11. The method of claim 10, further comprising:
    forming source and drain contacts through the dielectric layer, the source and drain contacts extending through the etch stop layer and the barrier layer, and further extending partially into the channel layer, respectively.

12. The method of claim 1, wherein forming the barrier layer comprises:
   forming an aluminum nitride layer over the channel layer; and
   forming an aluminum gallium nitride layer on the aluminum nitride layer.

13. The method of claim 12, wherein the etch stop layer has the aluminum content greater than the aluminum gallium nitride layer of the barrier layer.

14. A method, comprising:
   forming a channel layer of a gallium nitride field effect transistor (GaN FET), the channel layer including gallium and nitrogen;
   forming a barrier layer on the channel layer, the barrier layer including aluminum and nitrogen, wherein two-dimensional electron gas (2DEG) forms in the channel layer proximate the barrier layer as a result of forming the barrier layer, the 2DEG with a first free charge carrier density;
   forming a p-type gate layer over the barrier layer, the p-type gate layer including gallium and nitrogen;
   patterning the p-type gate layer to form a p-type gate of the GaN FET, wherein:
      the 2DEG under the p-type gate has a second free charge carrier density that is non-zero and less than the first free charge carrier density; and
      the 2DEG under the p-type gate is connected to the 2DEG outside a footprint of the p-type gate such that the GaN FET is normally on, the 2DEG outside the footprint of the p-type gate having the first free charge carrier density;
   forming a dielectric layer over the p-type gate and over the barrier layer; and
   forming source and drain contacts of the GaN FET, the source and drain contacts extending through the dielectric layer and the barrier layer, and further extending partially into the channel layer, respectively.

15. The method of claim 14, further comprising:
   forming an etch stop layer on the barrier layer, the etch stop layer including an aluminum content greater than the barrier layer.

16. The method of claim 14, wherein forming the barrier layer comprises:
   forming an aluminum nitride layer on the channel layer; and
   forming an aluminum gallium nitride layer on the aluminum nitride layer.

17. The method of claim 16, further comprising:
   forming an etch stop layer on the aluminum gallium nitride layer, the etch stop layer including an aluminum content greater than the aluminum gallium nitride layer.

18. The method of claim 14, wherein forming the p-type gate layer has a magnesium concentration of $1 \times 10^{17}$ cm$^{-3}$ to $1 \times 10^{20}$ cm$^{-3}$.

19. The method of claim 1, wherein the first free charge carrier density is greater than $8 \times 10^{12}$ cm$^{-2}$.

20. The method of claim 1, wherein the second free charge carrier density is 1 percent to 75 percent of the first free charge carrier density.

21. The method of claim 1, wherein:
   the first free charge carrier density is greater than $8 \times 10^{12}$ cm$^{-2}$; and
   the second free charge carrier density is 1 percent to 75 percent of the first free charge carrier density.

22. The method of claim 14, wherein the first free charge carrier density is greater than $8 \times 10^{12}$ cm$^{-2}$.

23. The method of claim 14, wherein the second free charge carrier density is 1 percent to 75 percent of the first free charge carrier density.

24. The method of claim 14, wherein:
   the first free charge carrier density is greater than $8 \times 10^{12}$ cm$^{-2}$; and
   the second free charge carrier density is 1 percent to 75 percent of the first free charge carrier density.

\* \* \* \* \*